(12) United States Patent
Yamashita et al.

(10) Patent No.: US 7,217,645 B2
(45) Date of Patent: May 15, 2007

(54) METHOD FOR MANUFACTURING SEMICONDUCTOR DEVICE AND ELECTRONIC DEVICE AND METHOD FOR CALCULATING CONNECTION CONDITION

(75) Inventors: Shiro Yamashita, Fujisawa (JP);
Masahide Harada, Yokohama (JP);
Kenichi Yamamoto, Kodaira (JP);
Munehiro Yamada, Hachioji (JP);
Ryosuke Kimoto, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/372,392

(22) Filed: Feb. 25, 2003

(65) Prior Publication Data
US 2003/0230806 A1 Dec. 18, 2003

(30) Foreign Application Priority Data
Feb. 28, 2002 (JP) ............................. 2002-052621
Dec. 16, 2002 (JP) ............................. 2002-363219

(51) Int. Cl.
*H01L 21/44* (2006.01)

(52) U.S. Cl. ............................. 438/612; 257/E21.503; 228/103

(58) Field of Classification Search ............... 438/176, 438/478, 201–203, 206–211, 337, 353, 378, 438/401, 410, 184, 193, 195, 608–615, 5–7, 438/10–11, 104, 106–114, 118, 141–123, 438/128, 129, 135, 142, 145, 149, 151, 157
See application file for complete search history.

(56) References Cited

U.S. PATENT DOCUMENTS 6,297,142 B1 * 10/2001 Mita et al. ................... 438/612
6,413,850 B1 * 7/2002 Ooroku et al. .............. 438/613
6,564,986 B1 * 5/2003 Hsieh ........................... 228/103
6,656,826 B2 * 12/2003 Ishimaru ...................... 438/612
6,846,735 B1 * 1/2005 Lin et al. ..................... 438/613
6,884,707 B1 * 4/2005 Cherian ....................... 438/611

(Continued)

FOREIGN PATENT DOCUMENTS

JP          2001-77528          3/2001

(Continued)

OTHER PUBLICATIONS

Shuji Nakata: Microsoldering in Future, Kogyo Chosakai Publishing Co., 1991, pp. 174-179.

(Continued)

*Primary Examiner*—Walter Lindsay, Jr.
*Assistant Examiner*—Andre' Stevenson
(74) *Attorney, Agent, or Firm*—Antonelli, Terry, Stout & Kraus, LLP.

(57) ABSTRACT

Solder is connected to the electrodes of the circuit board by using a temperature profile with a constant fusion temperature, a connection interface strength evaluation test is carried out on the soldered joints to obtain an appropriate reflow range free of decreases in the strength at the connection interface. On the basis of the appropriate reflow range obtained and using as the basis the chemical compound thickness which is determined uniquely by heat load, an appropriate reflow range in an optional temperature profile with one temperature peak is obtained. By carrying out connection in this appropriate reflow range, soldered joints can be obtained without decreases in the connection interface strength in the large-scale production stage.

8 Claims, 17 Drawing Sheets

U.S. PATENT DOCUMENTS

| | | | |
|---|---|---|---|
| 6,897,141 B2* | 5/2005 | Kim | 438/612 |
| 7,078,330 B2* | 7/2006 | Maeda et al. | 438/612 |
| 2001/0029095 A1* | 10/2001 | Tadauchi et al. | 438/612 |
| 2002/0034872 A1* | 3/2002 | Kazama et al. | 438/613 |
| 2004/0087130 A1* | 5/2004 | Kazama et al. | 438/613 |
| 2004/0175917 A1* | 9/2004 | Maeda et al. | 438/614 |
| 2004/0209452 A1* | 10/2004 | Kim | 438/613 |

FOREIGN PATENT DOCUMENTS

| | | |
|---|---|---|
| JP | 2001-237279 | 8/2001 |
| JP | 2001-274539 | 10/2001 |
| JP | 2002-43637 | 2/2002 |

OTHER PUBLICATIONS

Sato et al: High-Reliability Microsoldering Technology, Kogyo Chosakai Publishing Co., pp. 233-239.

Office Action Issued Sep. 3, 2004, in corresponding Republic of China Patent Application No. 03121767.2, with English translation.

Japanese Office Action, for Application No. JP 20002-363219, dated Oct. 11, 2005.

* cited by examiner

BACKGROUND

BACKGROUND

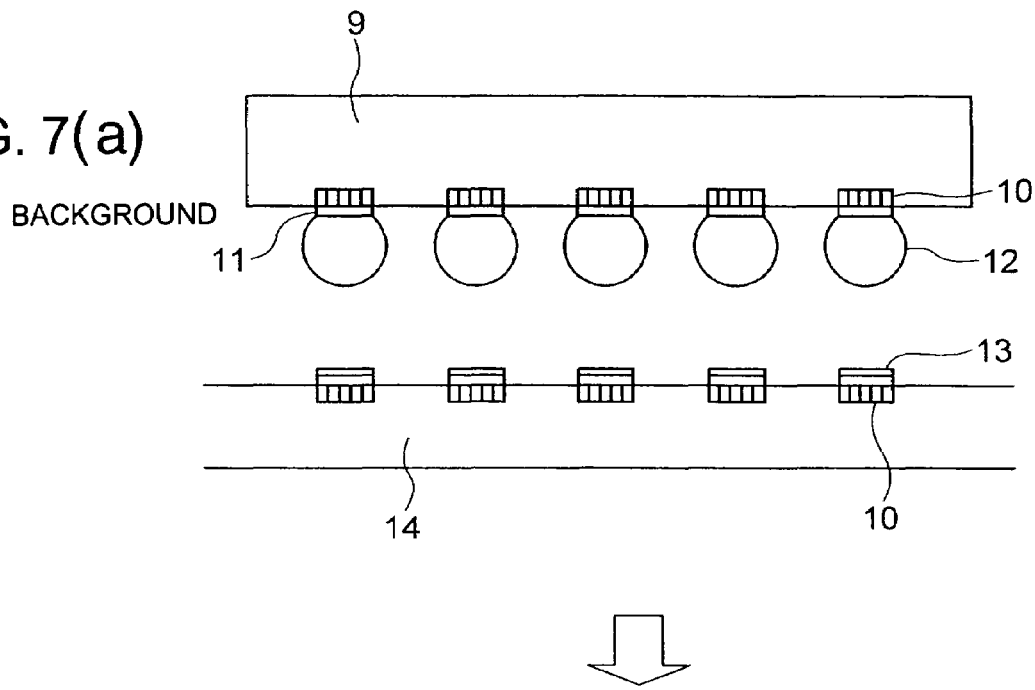
FIG. 7(a) BACKGROUND
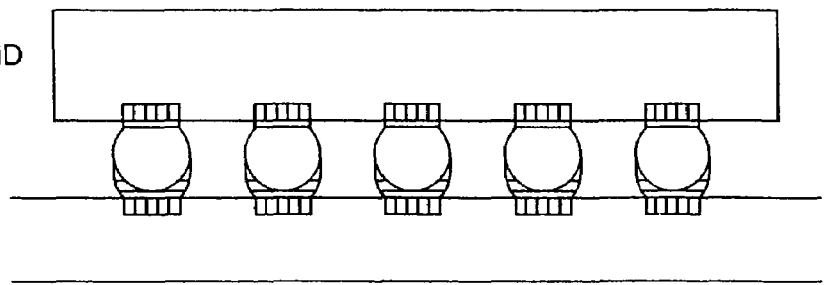
FIG. 7(b) BACKGROUND

METHOD FOR MANUFACTURING SEMICONDUCTOR DEVICE AND ELECTRONIC DEVICE AND METHOD FOR CALCULATING CONNECTION CONDITION

BACKGROUND OF THE INVENTION

1. Field of the Invention

The present invention relates to a method for calculating a condition for connecting electronic parts typified by semiconductor devices on electronic circuit boards.

2. Description of the Related Art

When an electronic part is mounted and connected to a circuit board by solder bumps as shown in FIG. 7, a temperature profile for soldering has conventionally been decided by considering thermal shock on the electronic part and solderability, such as wetting (Shuji Nakata: Microsoldering in Future, Kogyo Chosakai Publishing Co., 1991, pp. 174–179).

Besides, there are various types of reflow equipment, and the connection condition differs with the size of an electronic part and a circuit board to be joined together.

The connection condition, in other words, the heating condition is decided chiefly by the wettability of solder and the heat-resistance temperature of the electronic part.

A typical reflow condition is shown in FIG. 1 and the area above 220° C. of the graph in FIG. 1 is shown in FIG. 2.

SUMMARY OF THE INVENTION

In prior art, consideration has not been made of effects of the reflow condition on the connection strength after the above-mentioned connection by solder.

In other words, under the reflow condition shown in FIG. 1, when a plurality of electronic parts (including semiconductor devices) of different sizes are connected to one circuit board, because of differences in heat capacity among those parts, the connection points of smaller electronic parts are more susceptible to significant thermal hysterisis. A problem here is that when a large heat load is applied, the strength of the connection interface decreases, resulting in a fracture at the interface.

When rework is performed, the connection points of the electronic parts in the adjacent areas are subjected to a heat history, and as the number of times of rework increases, this heat history accumulates. As the heat history accumulates, a heat load increases at the connection points between the electronic part and the circuit board, increasing chances of a fracture at the interface.

In conjunction with those problems, as solder used for connection purposes, if a lead-free solder mainly comprises Sn and also containing at least either Ag or Cu (particularly, Sn; 3 wt % of Ag; 0.5 wt % of Cu), the connection points tend to be notably weak to a heat load. This is because the Pb-free solder has a high content of Sn which is liable to react with the metallization of the electrodes and the high melting point of this solder, higher than Sn37Pb, makes the working temperature higher, so that the elevated temperature has great effects on the strength of the connection interface.

Therefore, an object of the invention in this patent application is to improve the bond reliability of electronic devices when electronic parts are mounted on the electrodes on an electronic circuit board by using a lead-free solder.

Another object of the invention in this patent application is to provide a reflow condition suitable for connections mentioned above and a semiconductor device suitable for such connections.

The above objects can be achieved by the following mode of embodiment.

When a semiconductor device having a metal layer mainly composed of Ni and P is connected to an electronic circuit board having terminals by using a lead-free solder mainly composed of Sn and containing Ag and Cu, if they are joined together with solder placed between the electronic-circuit metal layer and the circuit-board terminals by heating the solder at temperatures not lower than 220° C. and not higher than 250° C. for not less than 40 seconds and not more than 80 seconds, the bond reliability between the electronic device and the electronic circuit board can be improved and therefore the reliability of the electronic device can be enhanced.

If the average heating rate or the average cooling rate under the heating condition of not lower than 220° C. is set between 0.7° C./s and 4.0° C., the connection reliability can further be improved.

If, as the heating condition, solder is heated to 230° C. or higher for 35 seconds or longer, the connection reliability can yet further improved.

Other objects, features and advantages of the invention will become apparent from the following description of the embodiments of the invention taken in conjunction with the accompanying drawings.

BRIEF DESCRIPTION OF THE DRAWINGS

FIG. 7 is a diagram showing a process step of joining an electronic part to an electronic circuit board;

THE DESCRIPTION OF EMBODIMENTS

Embodiment 1

The connection technology according to the present invention will be described with reference to FIG. 7.

FIG. 7(a) shows the condition before solder is heated, and FIG. 7(b) shows the condition after the solder is heated. On the electronic circuit board 14, a metal layer is formed by electroless Ni—P plating and a solder layer is formed by printing solder paste of Sn3Ag0.5Cu on Cu-electrode pads (or wiring pattern) 10 as parts of the electronic circuit.

In the electronic part 9, electrodes are formed on the reverse side of the electronic part and a Ni metal layer 11 is formed on the electrodes, and solder bumps 12 are formed on the metal layer 11 by initial reflow of solder balls of Sn3Ag0.5Cu.

By using the above-mentioned bumps formed on three semiconductor products (package parts), the three semiconductor products A (28-mm square, 256-pin, 1.27-mm pitch, 0.6-mm pad-diameter), B (18-mm square, 256-pin, 0.8-mm pitch, 0.4-mm pad-diameter), and C (5-mm square, 8-pin, 1.27-mm pitch, 0.6-mm pad-diameter) are connected to the electronic circuit board.

Figure 3:
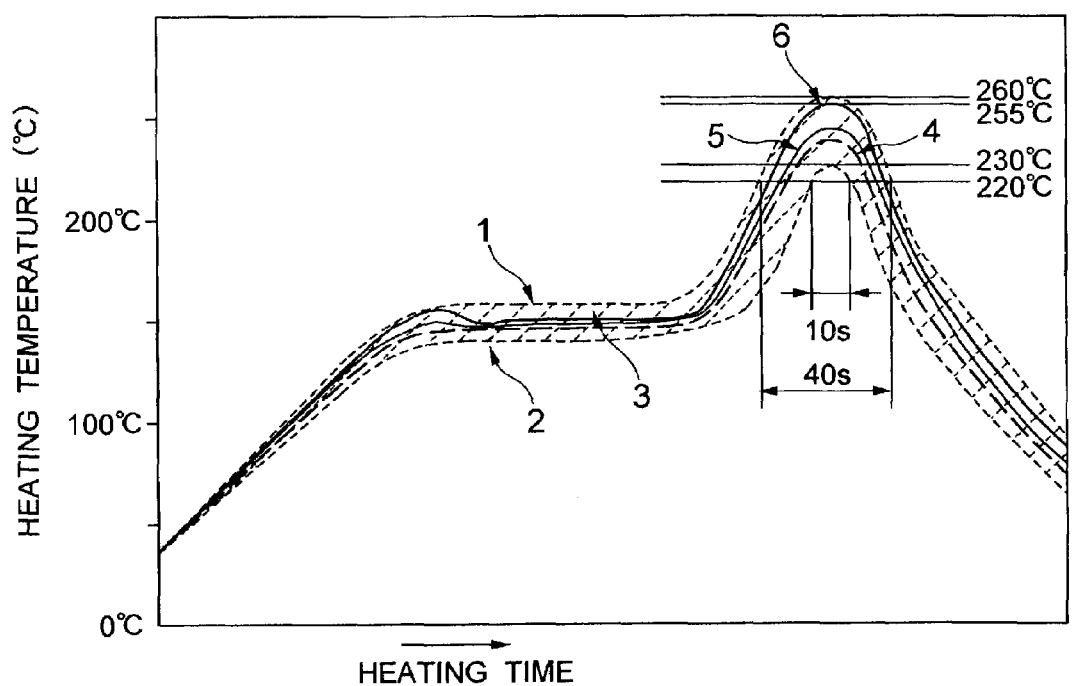
FIG. 3 is a diagram showing a condition for connecting three package parts to a test circuit board in a first embodiment of the present invention.

FIG. 3 shows the condition for connection to the electronic circuit board.

As shown in FIG. 3, the bumps were formed on the part A under conditions of a maximum temperature of 240° C. and for a reflow time of 30 s at 217° C. or higher, the bumps were formed on the part B under conditions of a maximum temperature of 245° C. and for a reflow time of 34 s at 217° C. or higher, and the bumps were formed on the part C under conditions of a maximum temperature of 255° C. and for a reflow time of 38 s at 217° C. or higher.

Twenty pieces of electronic circuit boards on which electronic parts are connected under the above-mentioned conditions were prepared, subjected to reflow, and then put to a flextural impact test, after which the connection reliablity was evaluated.

Figure 1:
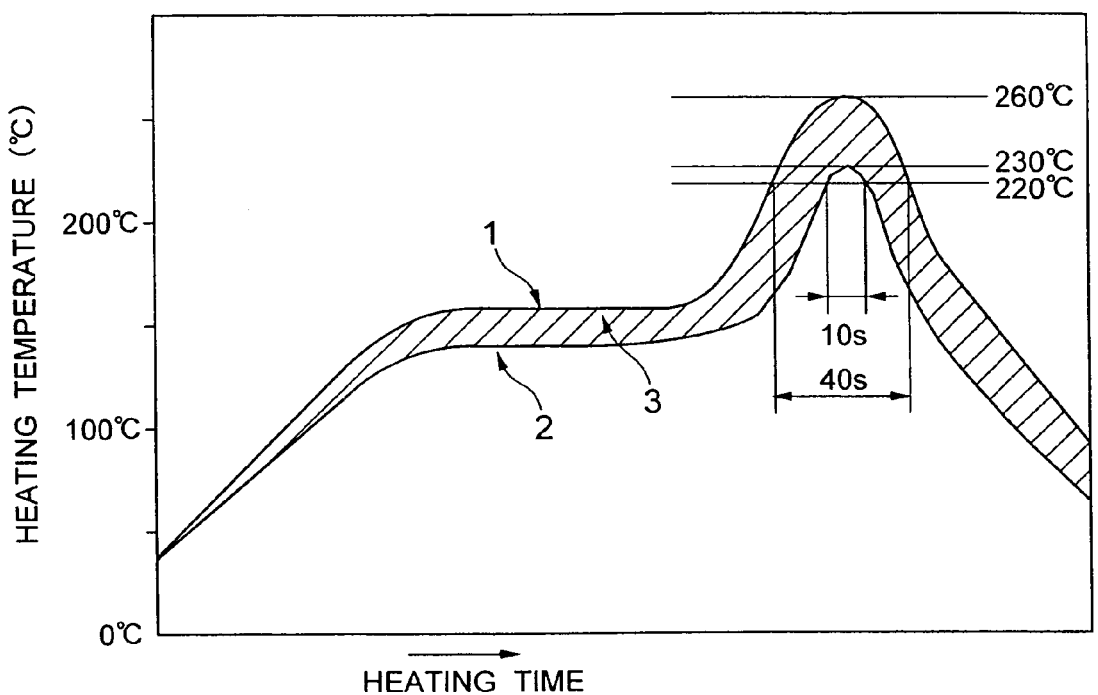
FIG. 1 is a diagram showing a condition for connecting an electronic part to an ordinary circuit board by using solder bumps.
Figure 2:
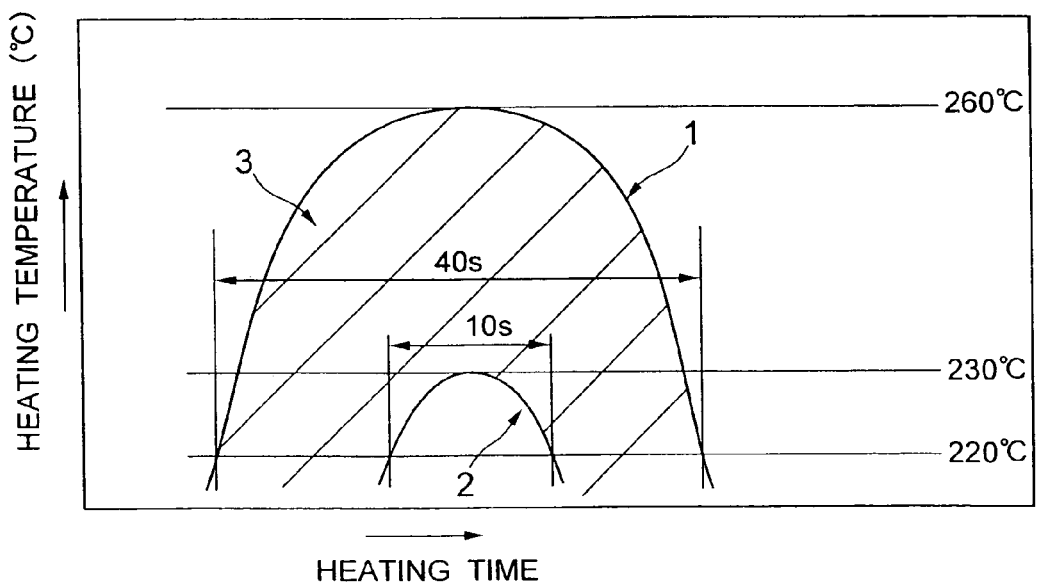
FIG. 2 is a diagram showing the area at 220° C. and higher of the condition for connecting an electronic part to an ordinary circuit board by using solder bumps.

Though all package parts were bonded at the temperature which, measured at the center on the upper surface of the package part, was within the connection condition shown in FIG. 1, the parts C, which were smallest in size and in which the connection condition reached the maximum temperature of 255° C., broke off at the connection interface on 7 pieces of the total of 20 pieces of the test circuit boards.

From this, it is understood that there is a possibility that improper connection occurs even though the connection was carried out in accordance with the profile data in FIG. 1.

Embodiment 2

Figure 4:
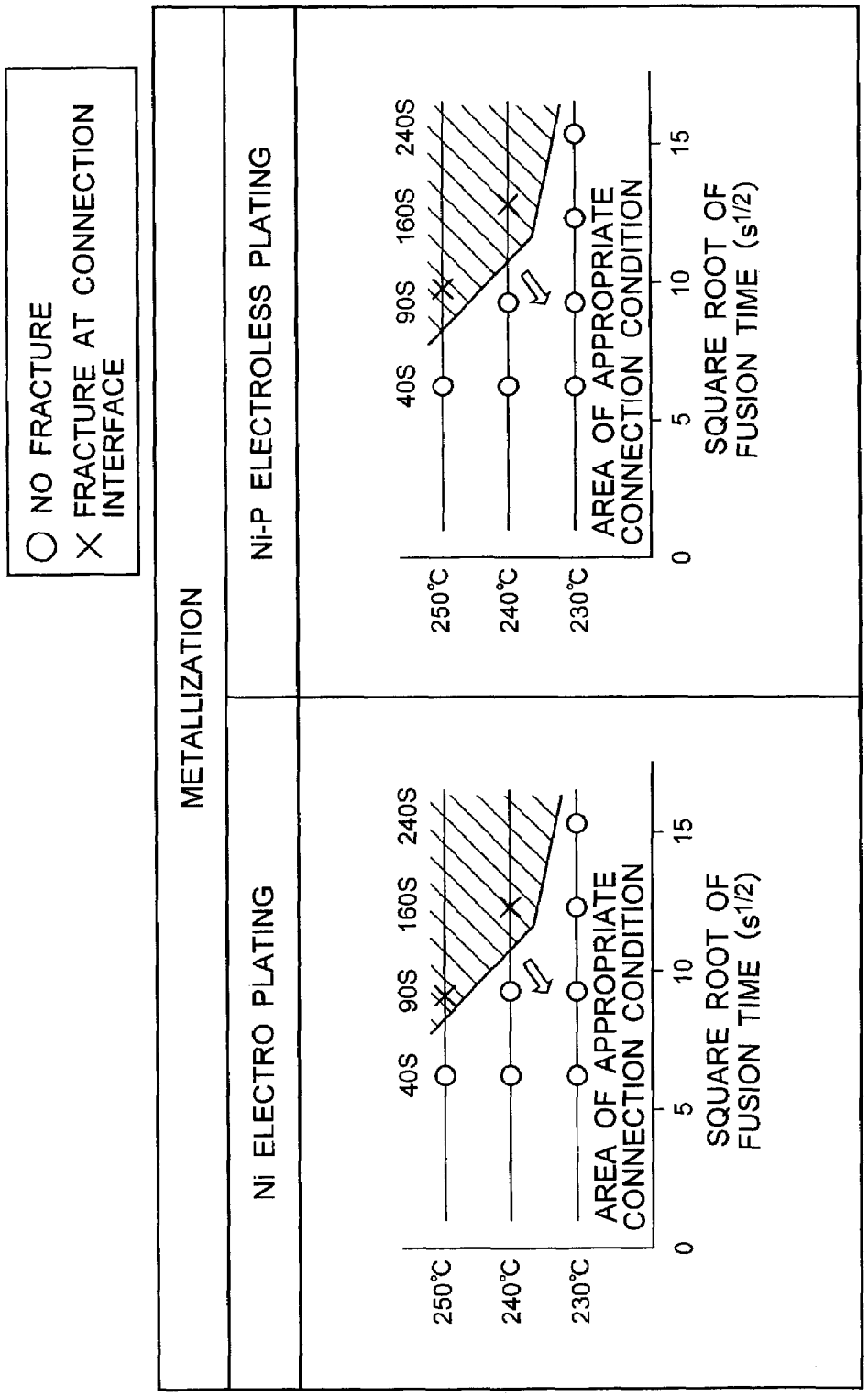
FIG. 4 is a diagram showing results of flextural impact test and evaluation on samples in which bumps were formed on the above-mentioned package part and connected to the circuit board by solder paste in a second embodiment.
Figure 5:
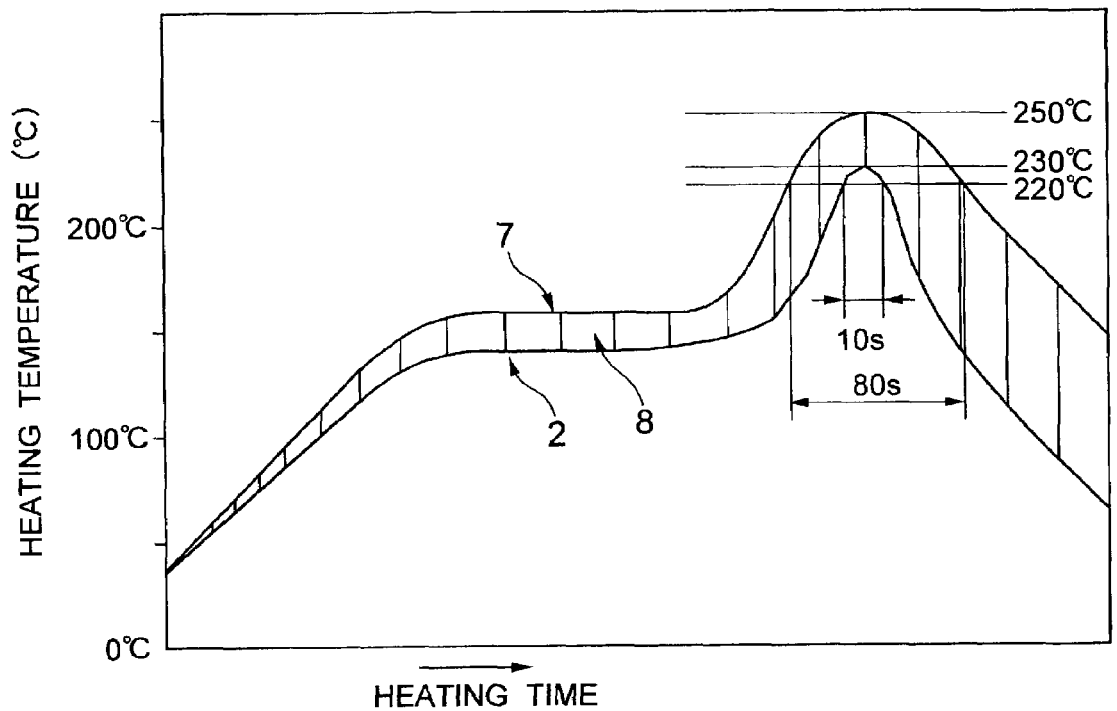
FIG. 5 shows an appropriate condition for connection at a maximum temperature of 250° C. obtained from the results of the flextural impact test and evaluation in the second embodiment.
Figure 6:
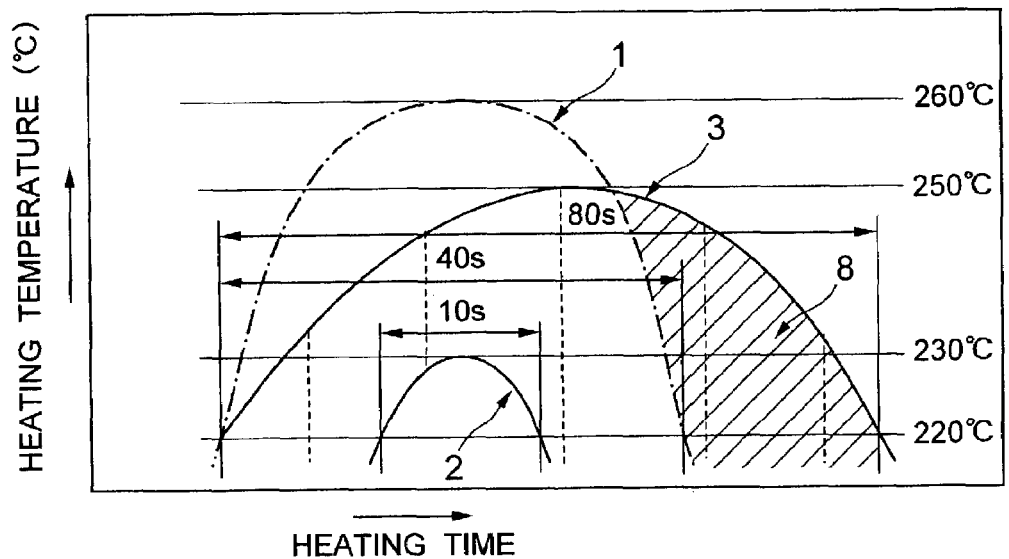
FIG. 6 shows the area at 220° C. or higher of the appropriate connection condition at a maximum temperature 250° C. obtained from the results of the flextural impact test and evaluation in the second embodiment.

Bumps by solder balls were formed on the package parts of 25-mm square, 256-pin (1.27-mm pitch, 0.6-mm pad diameter), and then the package parts were connected to a test circuit board by using solder paste. The solder balls were formed by Sn3Ag0.5Cu (ball diameter 0.75 mm), the solder paste was formed by Sn3Ag0.5Cu, and the metallization on the electrode pads was formed by electroless Ni—P plating (8 μm in thickness). The solder bumps were formed under conditions of a maximum temperature of 240° C. and for a reflow time of 40 s at 217° C. or higher. The connection condition to the circuit board was at maximum temperatures of 230° C., 240° C. and 250° C. and for reflow times of 40 s, 90 s, 160 s and 240 s at not lower than the Sn3Ag0.5Cu-paste melting point of 217° C. After the connection process, a flextural impact test was conducted and the connection reliability was evaluated. FIG. 4 shows results of flextural impact test. It is obvious from FIG. 4 that fractures occurred at the connection interface under the conditions of 250° C. and 90 s or more, or 240° C. and 160 s or more. On the other hand, there was not any fracture in the flextural impact test under the conditions of 250° C. and 40 s or less, or 240° C. and 90 s or less, which means that good connections could be obtained. It was concluded from the results shown in the graph that the region free of decreases in connection reliability, in other words, a region where the maximum temperature is 250° C. and the reflow time at 220° or higher is 80 s or less, and a region where the maximum temperature is 240° C. and the reflow time at 220° C. or higher is 150 s or less are appropriate connection conditions. FIG. 5 shows a case of the maximum temperature of 250° C. out of the appropriate conditions for connection to the circuit board. FIG. 6 shows the area where the temperature is 220° C. and higher in FIG. 5.

As is clear from FIGS. 5 and 6, when manufacturing a semiconductor device, in which bumps of a lead-free solder of Sn—Ag—Cu system are formed on the metal layer mainly composed of Ni and P, and an electronic circuit board with electrodes, by heating the lead-free solder for not less than 40 s and not longer than 80 s in a temperature range of 220° C. to 250° C., the connection reliability can be improved.

Moreover, it is also understood that by setting the average heating rate or the average cooling rate of the heating temperature of the range of 217° C. and higher in FIG. 6 so as to be not lower than 0.7° C. and not higher than 4.0° C., the connection reliability can still further be improved.

Further, it has become clear that by heating the solder at not higher than 250° C. and not lower than 230° C. for 35 s or longer, the connection reliability can additionally improved.

If information that, in a semiconductor device having bumps of Sn—Ag—Cu lead-free solder formed on the metal layer mainly composed of Ni and P, the above-mentioned lead-free solder can be heated in a temperature range of 220° C. to 250° C. for not shorter than 40 s and not longer than 80 s as well as electronic devices according to this information is disclosed in writing or on the Internet by a semiconductor equipment manufacturer or an electronic part maker, it becomes possible for electronic device manufacturing firms (set makers), which use semiconductor devices or electronic parts, to provide electronic circuit devices with improved connection reliability.

Embodiments 3 and 4

Next, as a result of study to disseminate those connection conditions in a wider range of applications, it has become apparent that profiles should preferably be generated by the following method.

Note that the quality of the plated layer on the electrodes, used for the study, differs with different lots, plating material manufacturers, or plating equipment and there may be some errors between this plated layer and any of the plated layers of the earlier-mentioned embodiments.

Figure 8:
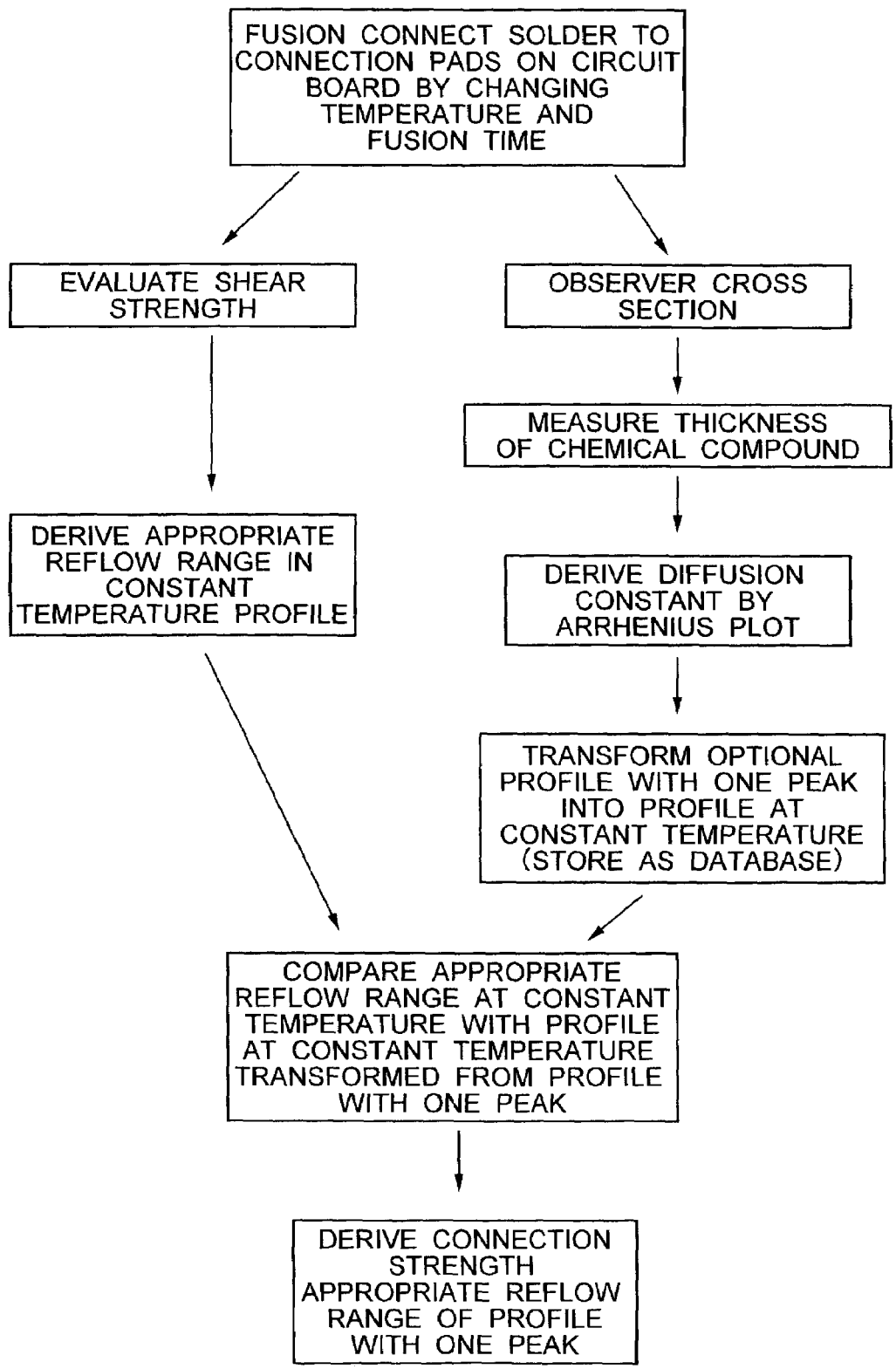
FIG. 8 is a flowchart showing a method for obtaining an appropriate reflow range where the connection interface strength does not drop.
Figure 9:
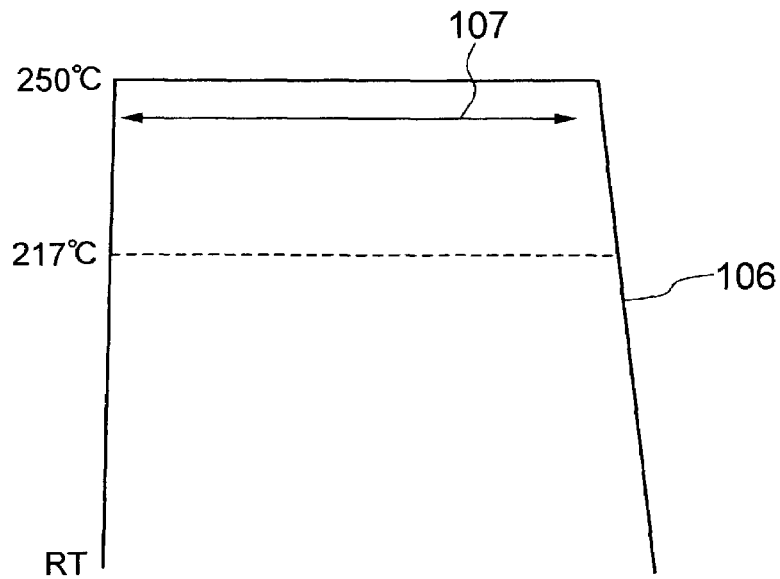
FIG. 9 is a diagram showing an example of a temperature profile when the fusion temperature is constant (constant at 250° C.)

FIG. 8 is a flowchart of a method for obtaining a temperature profile in which there is no decrease in the strength of the connection interface. Solder is connected to the connection pads of a circuit board by changing the different reflow temperature and the reflow time. For simplicity's sake, this connection of solder is carried out by using a temperature profile in which the reflow temperature is constant as shown in FIG. 9. After this, a shear test is performed under different conditions, by which to obtain a range of an appropriate reflow condition that does not cause fracture at the connection interface. On the basis of the appropriate reflow range, a decision is made whether or not the connection temperature profile is appropriate.

Figure 10:
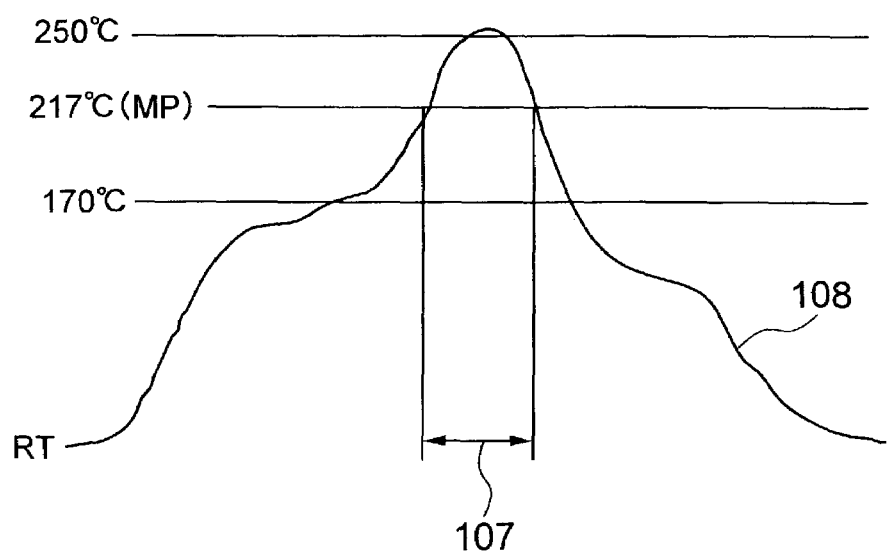
FIG. 10 is a diagram showing an example of a temperature profile that has one peak.

However, the appropriate reflow range thus obtained is a heating profile at constant temperature and therefore differs from a profile with one peak used for production on a large scale as shown in FIG. 10. Therefore, this appropriate reflow range cannot be put into use as it is. Consequently, on the basis of a concept that whether or not an interface fracture occurs is decided by a heat load and that substances, which have the same chemical compound thickness decided by a heat load, are subject to an equivalent heat load, the appropriate reflow range in a constant-temperature heating profile is converted by calculation into an appropriate reflow range in a heating profile with a peak.

According to Sato et al: High-Reliability Microsoldering Technology, Kogyo Chosakai Publishing Co., pp. 233–239, it is known that the thickness of a chemical compound is the consequence of the rule of diffusion √t shown in Eqs. (1) and (2).

$$X = \sqrt{2Dt} \qquad \text{Eq. (1)}$$

$$D = D_0 \exp\left(\frac{-Q}{kT}\right) \qquad \text{Eq. (2)}$$

X(μm): Diffusion distance (Chemical compound thickness)
D(μm²/s): Apparent diffusion constant
t(s): Time (Reflow time at melting point or higher)
T(K): Solder reflow temperature
$D_0$(μm²/s): Frequency factor
Q(eV): Activation energy
k(eV/K): Boltzmann constant ($=8.62 \times 10^{-5}$))

$$T - 217 = (T_{max} - 217)\sin\left(\frac{\pi}{t_m} \cdot t\right) \qquad (0 \le t \le t_m) \qquad \text{Eq. (3)}$$

$T_{max}$: Maximum temp. (° C.),
$t_m$: Reflow time (s) at 217° C. or higher $$X^2 = \qquad \text{Eq. (4)}$$
$$\sum 2D_0 \exp\left(\frac{-Q}{kT_i}\right) \cdot \Delta t_i = 2D_0 \exp\left\{\frac{-Q}{k(250+273)}\right\} \cdot t_{250}$$

$t_{250}$: Reflow time (s) in terms of a profile at constant temperature

Figure 11:
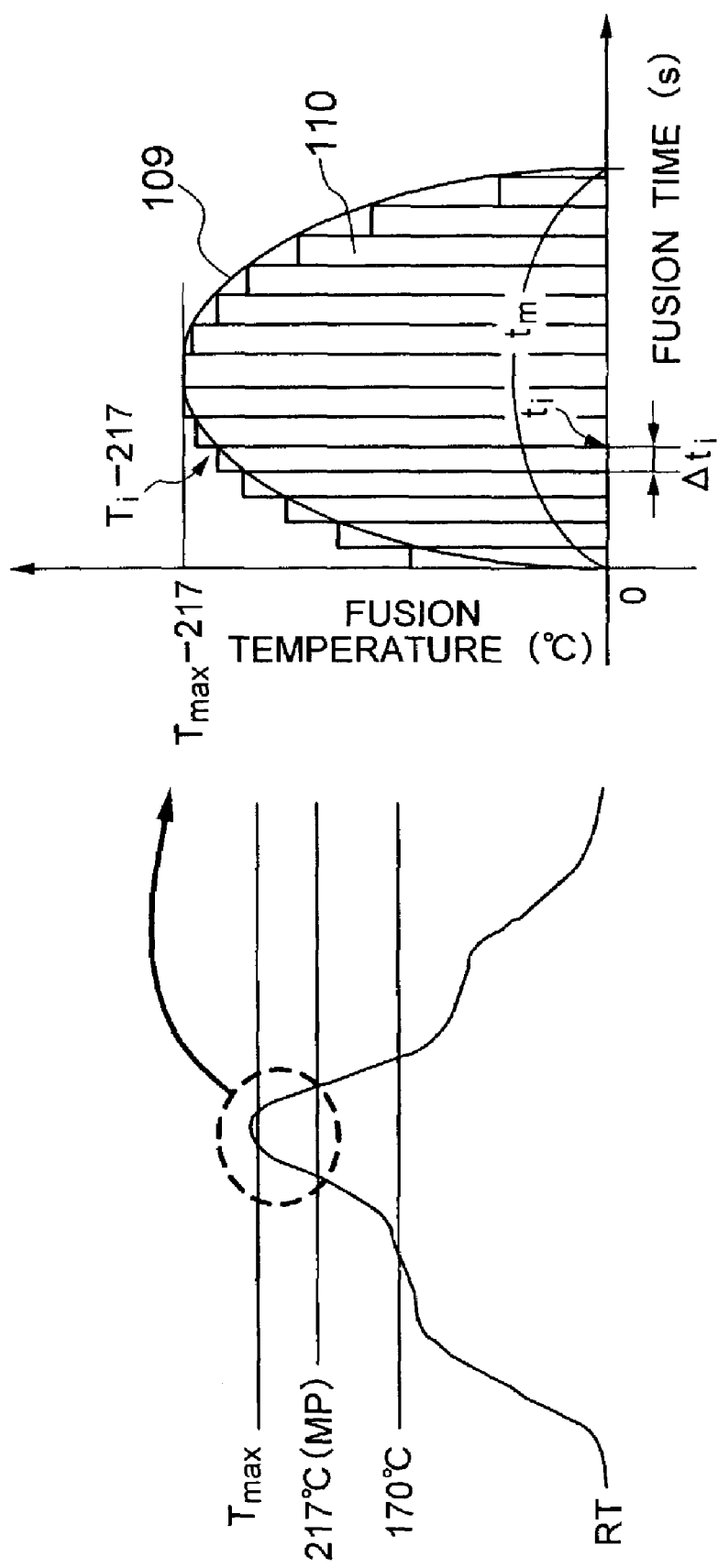
FIG. 11 shows as an example that area of the above-mentioned temperature profile above the solder melting point which has been approached to a sinusoidal half wave and divided into minute intervals.

By obtaining the frequency factor D0 as a diffusion constant and the activation energy Q in Eq. (2), the chemical compound thickness is determined uniquely if the reflow temperature and the fusion time are decided. Accordingly, the sectional area of the interface between the solder and the connection pad is observed, the thickness of a chemical compound formed there is obtained, Arrhenius plot is performed from the chemical compound thickness obtained, and then the frequency factor and the activation energy in Eq. (2) are obtained. As shown in FIG. 11, that area of an optional profile with one peak which is higher than the melting point of solder is approximated to a sinusoidal half wave, and the chemical compound thickness is calculated from the frequency factor D0 and the activation energy Q obtained, in each of small intervals formed by dividing the sinusoidal half wave, and all of the thicknesses are added up to obtain a chemical compound thickness under total heat load. Supposing that a constant-temperature heating profile that gives heat load to grow the chemical compound by the obtained thickness is equivalent to a profile with one peak, an appropriate reflow range of a profile with one peak is obtained from an appropriate reflow range under the constant-temperature heating profile condition already obtained. Eq. (3) shows an approximate expression of the profile and Eq. (4) shows a transformation formula into a profile at constant temperature of 250° C.

From the equations shown above, it is possible to obtain an appropriate reflow range free of a decrease in connection interface strength under the condition of a profile with one peak as shown in FIG. 10. By connecting solder in the appropriate reflow range that has been obtained, connections can be obtained which leave no chance of a decrease occurring in the connection interface strength in the mass production stage.

Embodiment 3

Figure 12:
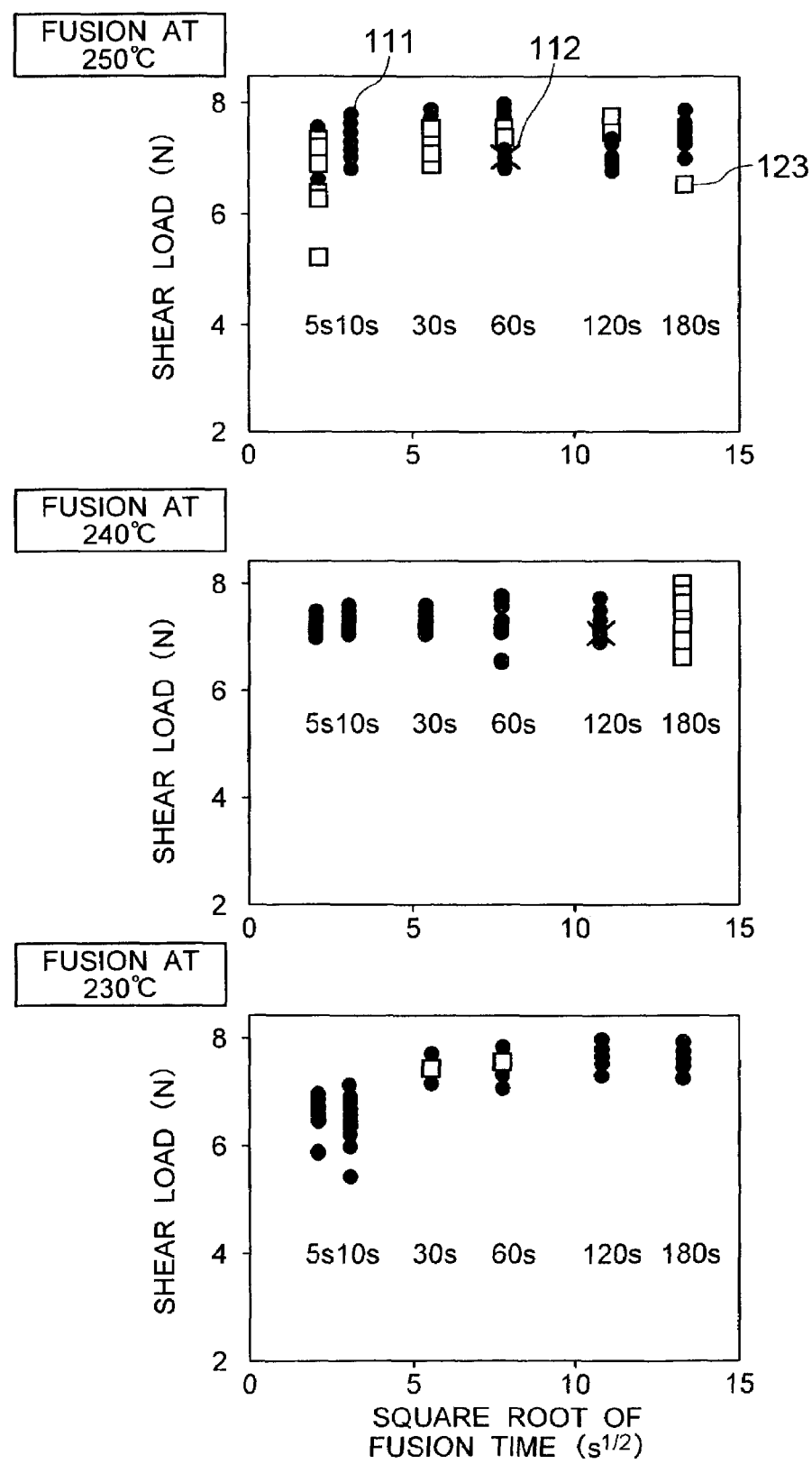
FIG. 12 is a diagram showing results of a shear test and evaluation on solder bumps connected in accordance with a profile at constant temperature in a third embodiment.
Figure 13:
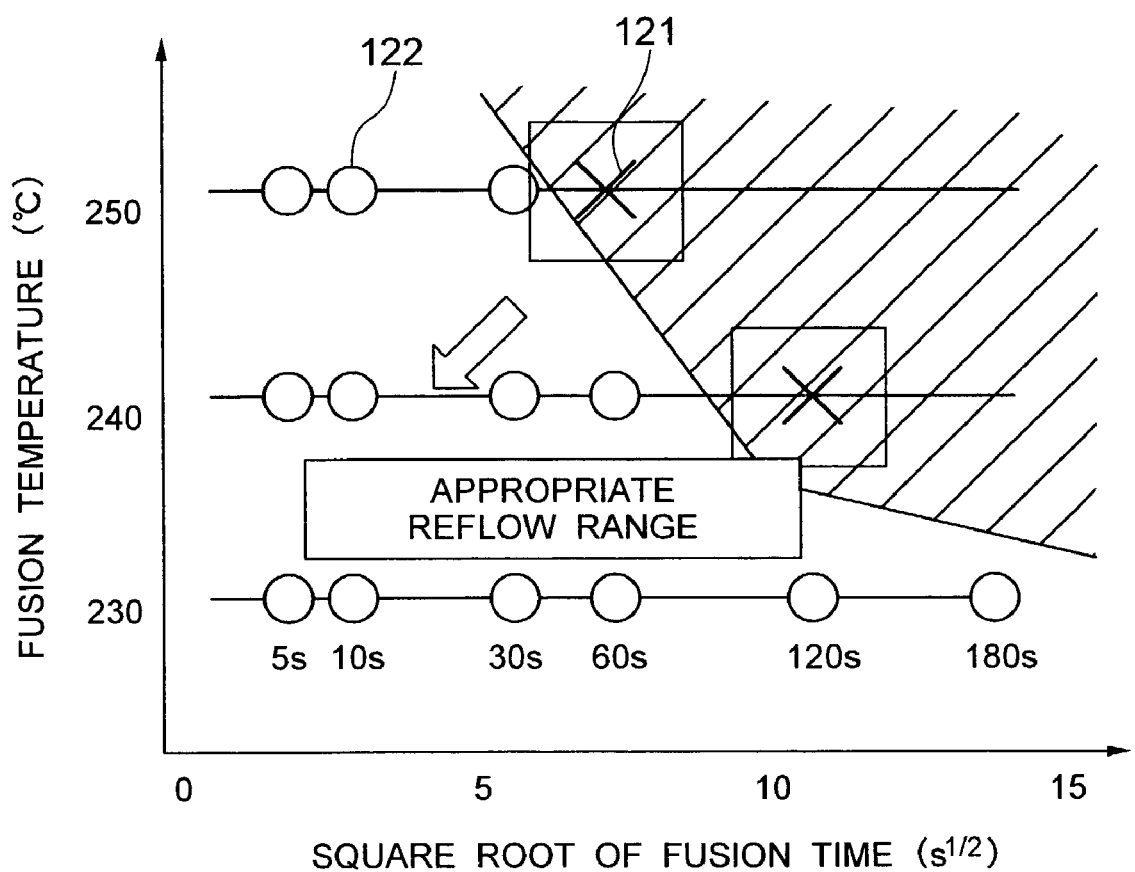
FIG. 13 shows an appropriate reflow range obtained by shear test and evaluation on solder bumps connected in accordance with a profile at constant temperature in the third embodiment.

Solder balls of Sn3Ag0.5Cu are connected by reflow to a circuit board having electrode pads formed as the metallization of Cu/electroplated Ni/Au, by which process solder bumps are formed. The connection condition in this process was a profile at constant temperature as shown in FIG. 9, and bumps were formed by changing the reflow temperature from 230° C. to 240° C., and 250° C., and changing the reflow time from 5 s, 10 s, 30 s, 60 s, 120 s and 180 s. After this, the bumps were put to a shear test. FIG. 12 shows results of the shear test. From the test results, an appropriate reflow range of the metallization under evaluation was obtained. FIG. 13 shows the appropriate reflow range. A mode in which fracture occurred was used as the standard by which to decide if the strength of the connection interface dropped or not. When a fracture occurred in the solder in all bumps, a decision was made that there was no drop in the interface strength. If there was even one bump in which a fracture occurred at the interface between the solder and the metallization, a decision was made that there was a drop in strength. The number of bumps put to shear test was ten in each sample.

Figure 14:
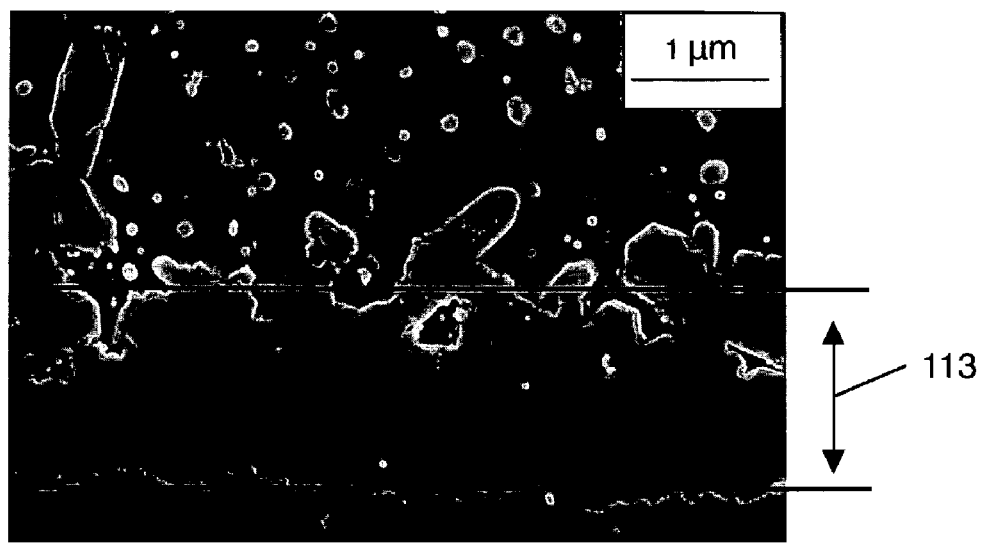
FIG. 14 shows an example of cross-section observation by SEM of solder bumps connected in accordance with a profile at constant temperature (reflow at 250° C. for 180 s) in the third embodiment.
Figure 15:
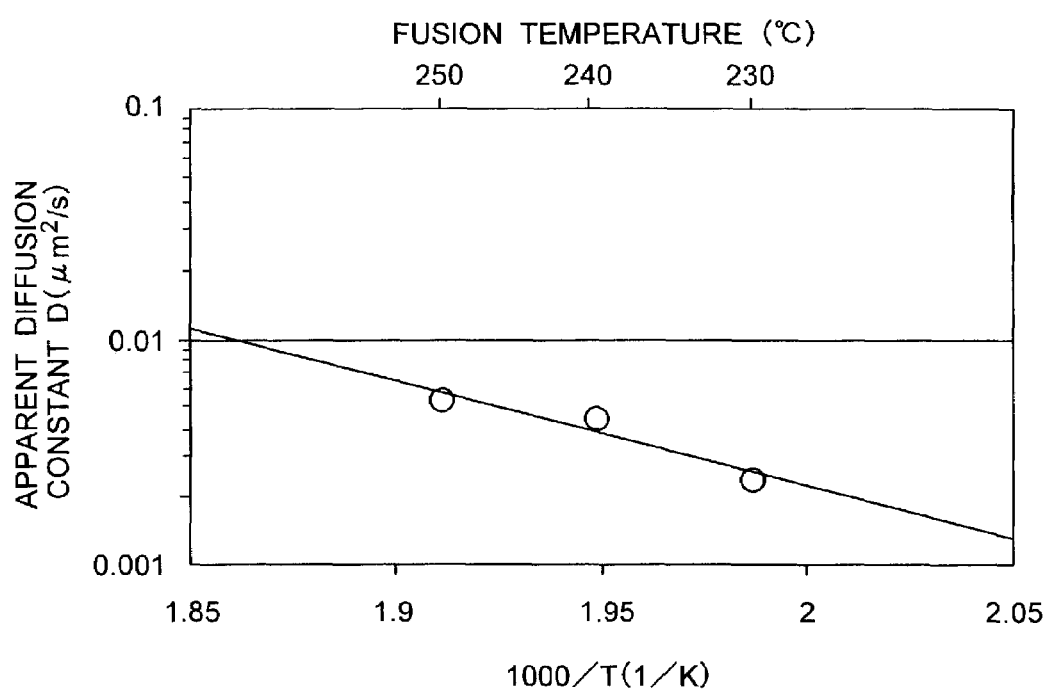
FIG. 15 is an Arrhenius-plot diagram formed by obtaining a thickness of a chemical compound from a sectional SEM photo of solder bumps connected in accordance with a profile at constant temperature in the third embodiment to show a relation between the reciprocal of reflow temperature and a square of the chemical compound thickness.

Then, the bumps formed under condition of a reflow temperature of 230° C., 240° C., or 250° C. and a fusion time of 180 s were observed in cross section under SEM. FIG. 14 shows an example of observation photograph. From this photograph, the thickness of the chemical compound was obtained, and the relation between the reciprocal of the reflow temperature and the apparent fusion constant was obtained as an Arrhenius plot. FIG. 15 shows the Arrhenius plot. On the basis of the Arrhenius plot and from the rule $\sqrt{t}$ of diffusion in Eqs. (1) and (2), the frequency factor D0 and the activation energy Q were obtained. The frequency factor was $D0=5.56\times10^6$ ($\mu m^2/s$) and the activation energy was $Q=0.93$ (eV).

Figure 16:
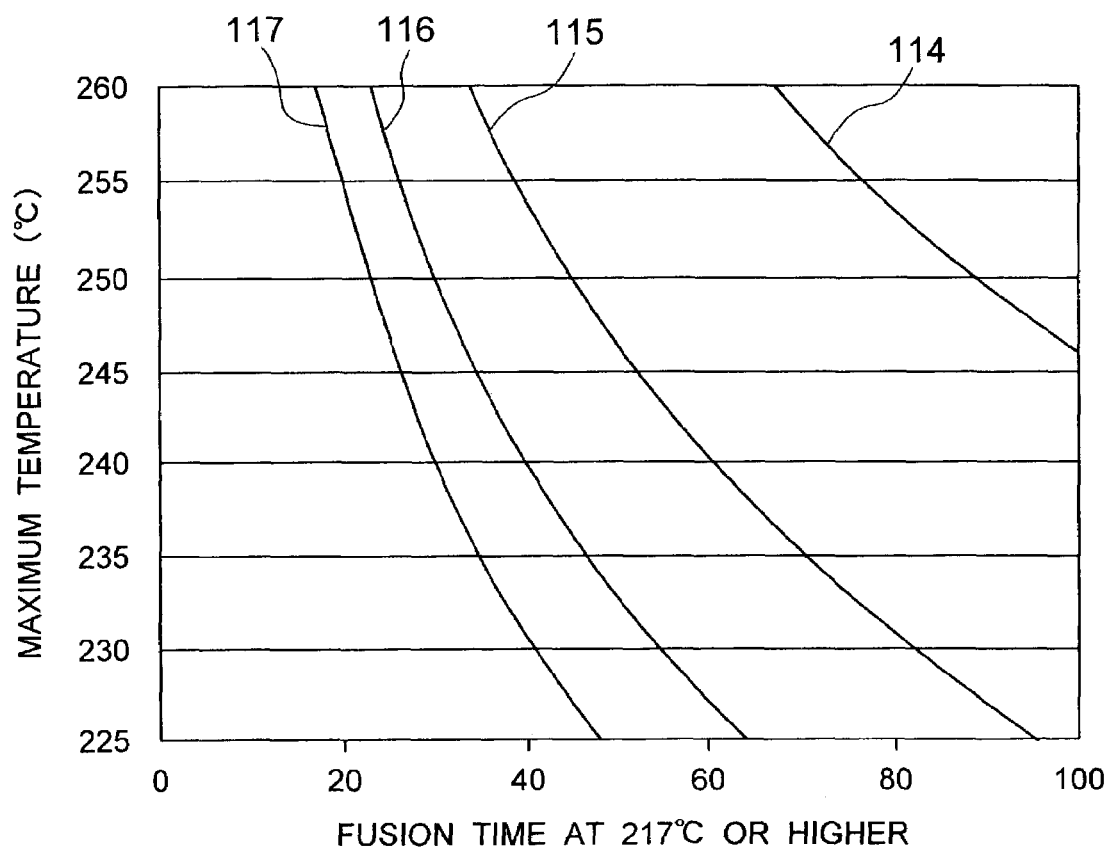
FIG. 16 shows a connection temperature appropriate reflow range in relation to a profile condition with one peak in the third embodiment.

Then, on the basis of the frequency factor D0 and the activation energy Q obtained, the appropriate reflow range in FIG. 13 was transformed to an appropriate reflow range in a temperature profile with one peak. All temperature profiles with one peak, in which the maximum temperature in the range of 225° C. to 260° C. considered suitable for the connection condition of solder balls of Sn3Ag0.5Cu was divided into 1° C. units and the reflow time in the range of 10 to 100 s was divided into 10 s units, were approximated to a sinusoidal half wave in FIG. 11, were divided into minute intervals, and from the values of the frequency factor D0 and the activation energy Q that had been obtained, the chemical compound thickness for each of the minute intervals was calculated by using Eqs. (1) and (2), and the chemical compound thicknesses for all heat loads were obtained and stored as a database. Because the connection interface strength drops in 60 s at 250° C. in the appropriate reflow range in FIG. 13, this condition was regarded as a border between appropriate and inappropriate, a range of a temperature profile with one peak corresponding to a chemical compound thickness when the connection was carried out under this condition was obtained from the database. FIG. 16 shows an appropriate reflow range in a temperature profile with one peak. For simplicity's sake, in the above calculations, the bump forming condition, the reflow condition to the circuit board, and the condition of heat load applied in rework were all supposed to be identical, an appropriate reflow range obtained with the number of rework taken into account is also shown.

A verification process was carried out on the appropriate reflow range in a temperature profile with one peak that was obtained as shown in FIG. 16. In a circuit board with electrode pads formed as the metallization of Cu/electroplated Ni/Au, solder bumps were formed by reflow-connecting solder balls of Sn3Ag0.5Cu to the electrode pads. As the reflow condition, a temperature profile with one peak having the maximum temperature of 240° C. and the fusion times, at not lower than 217° C. as the melting point of Sn3Ag0.5Cu, of 20 s, 35 s, 50 s, and 80 s was used, and heat load was applied once to four times to each sample. After this, a shear test was carried out on the formed solder bumps. The number of bumps put to shear test was ten in each sample. Fracture occurred in solder in all samples in which the solder bumps were connected for reflow time of 20 s at 217° C. or higher and which were given a reflow process 1 to 4 times. On the other hand, a fracture mode occurred in which the interface split: in those samples of reflow time of 35 s subjected to a reflow process 4 times, in those samples of reflow time of 50 s subjected to the reflow process 3 to 4 times, and in those samples of reflow time of 80 s subjected to the reflow process 2, 3 or 4 times. As described, it could be verified that the appropriate reflow range in a temperature profile with one peak in FIG. 16 is most likely to be correct.

Embodiment 4

Figure 17:
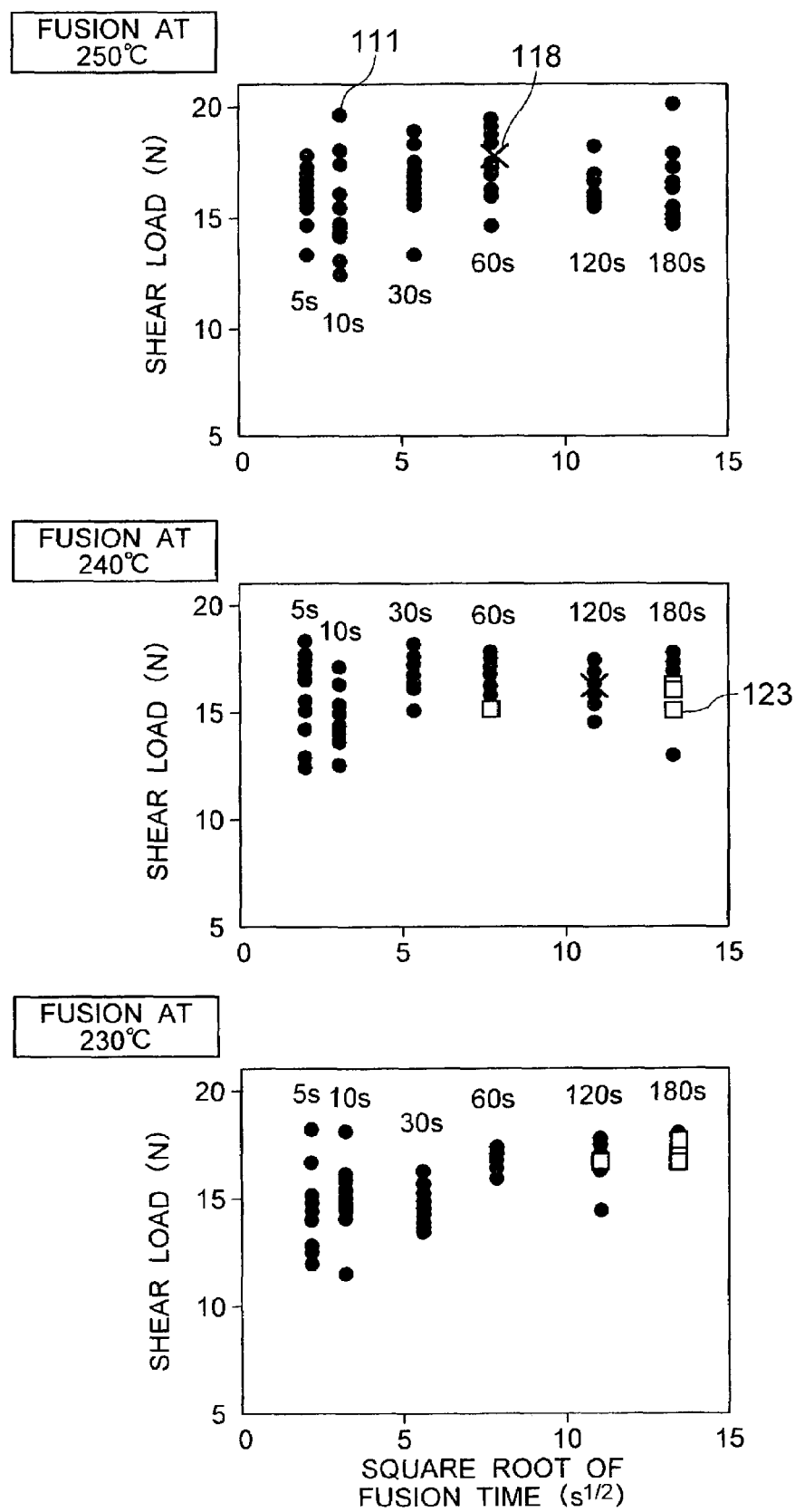
FIG. 17 shows results of shear test and evaluation on solder bumps connected in accordance with a profile at constant temperature in a fourth embodiment.
Figure 18:
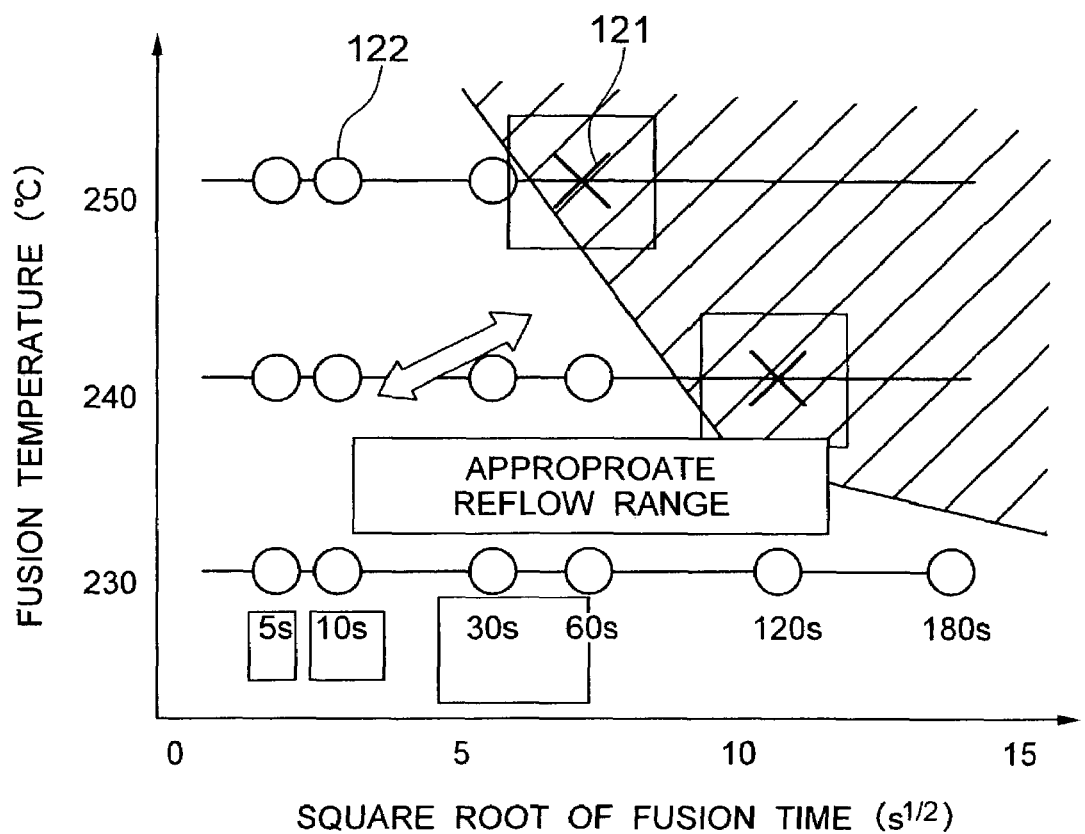
FIG. 18 shows an appropriate reflow range obtained by shear test and evaluation on solder bumps connected in accordance with a profile at constant temperature in the fourth embodiment.

Next, in a circuit board having electrode pads formed as the metallization of Cu/electroless-plated Ni—P/Au, solder balls of Sn3Ag0.5Cu were reflow-connected to the electrode pads, by which solder bumps were formed. The connection condition at this time was a profile at constant temperature as shown in FIG. 9. The bumps were formed by changing the reflow temperature from 230° C. to 240° C. and 250° C. and changing the reflow time from 5 s to 10 s, 30 s, 60 s, 120 s and 180 s. Subsequently, a shear test was conducted on the formed bumps. FIG. 17 shows results of shear test. From the shear test results, an appropriate reflow range for the metallization evaluated in this case was obtained. FIG. 18 shows the appropriate reflow range. The standard by which to decide if the strength of the connection interface decreased was by a mode of fracture, namely, by how fracture occurred. In other words, those samples in which fracture occurred in the solder of all bumps of them are judged to be free of drop in strength. The mode of fracture in which fracture occurred at the interface between solder and the metallization even in one bump in a sample was a basis on which a decision was made that there was a decrease in strength in the sample. The number of bumps put to shear test was ten in each sample.

Figure 19:
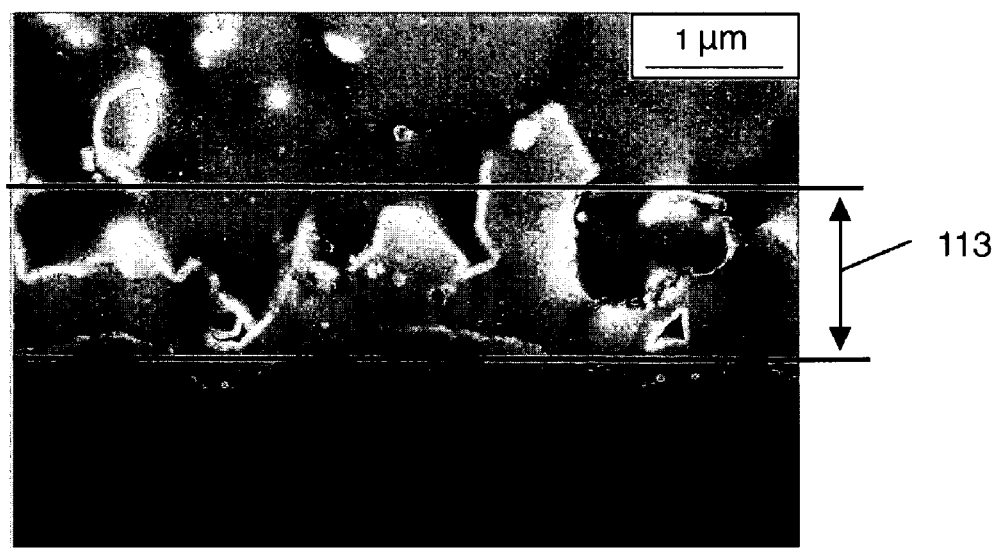
FIG. 19 shows an example of cross-section observation by SEM of solder bumps connected in accordance with a profile at constant temperature (reflow at 250° C. for 180 s) in the third embodiment.
Figure 20:
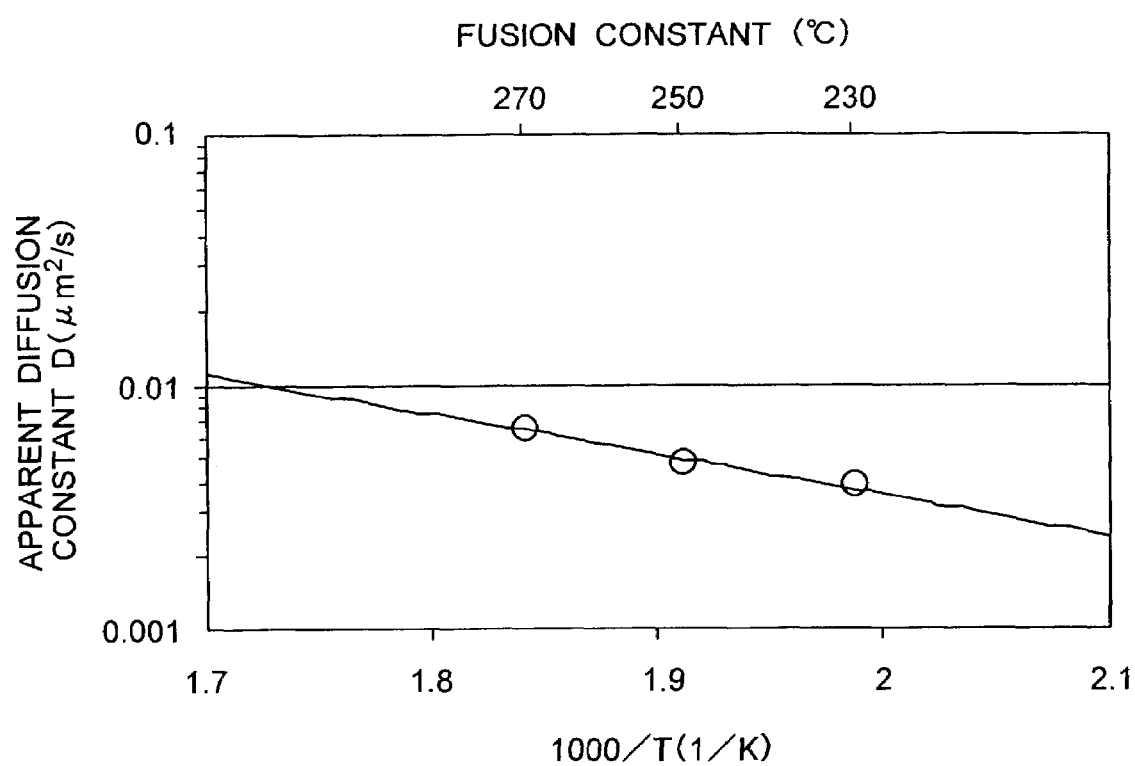
FIG. 20 is an Arrenius-plot diagram formed by obtaining a thickness of a chemical compound from a sectional SEM photo of solder bumps connected in accordance with a profile at constant temperature in the third embodiment to show a relation between the reciprocal of reflow temperature and a square of the chemical compound thickness.

Then, bumps were formed under conditions of reflow temperature of 230° C., 250° C. and 270° C. and fusion time of 180 s, and the bumps were observed in cross section under SEM. FIG. 19 shows an example of observation photograph. From this photograph, the thickness of the chemical compound was obtained, and a relation between the reciprocal of the fusion temperature and the apparent diffusion constant was obtained as an Arrhenius plot, which is shown in FIG. 20. On the basis of this Arrhenius plot and from the rule $\sqrt{t}$ of diffusion in Eq. (2), the frequency factor D0 and the activation energy Q were obtained. The frequency factor was $D0=5.77$ ($mm^2/s$) and the activation energy $G=0.31$ (eV).

Figure 21:
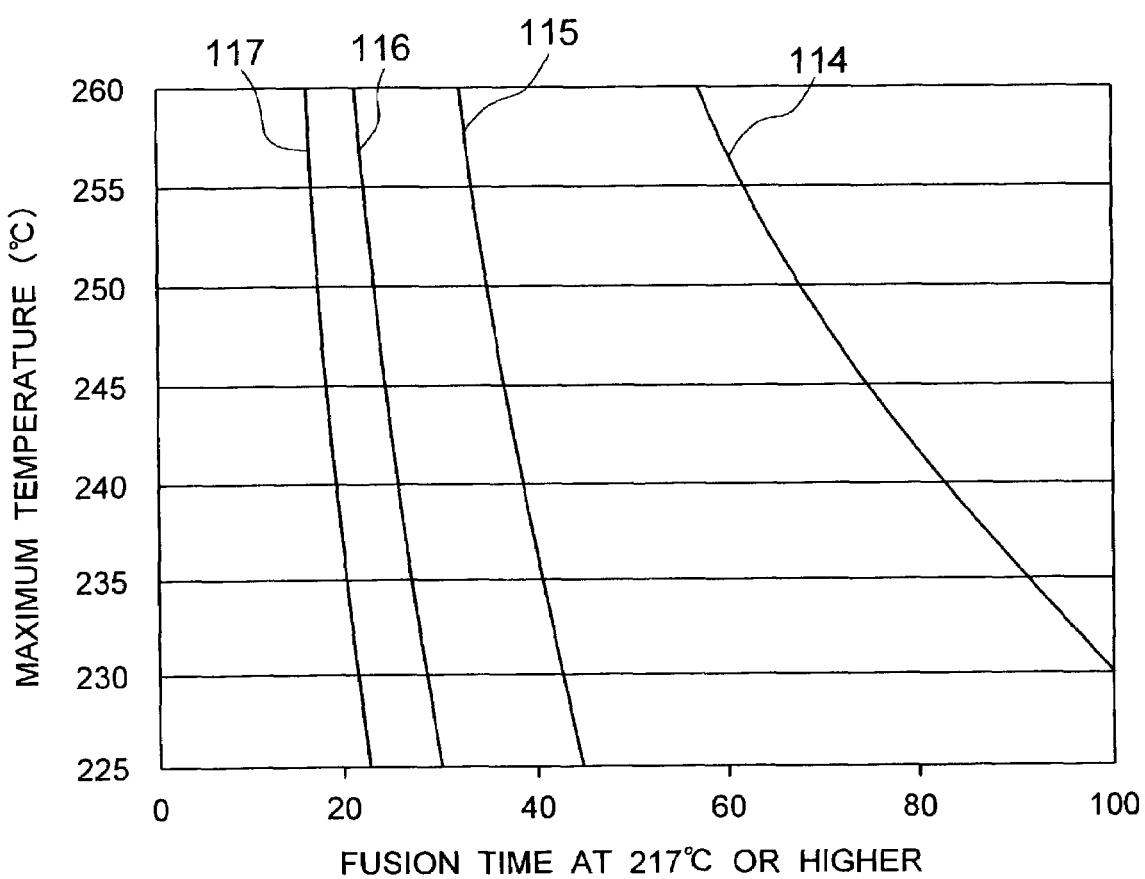
FIG. 21 shows a connection temperature appropriate reflow range in relation to a profile condition with one peak in the fourth embodiment.

Then, on the basis of the frequency factor D0 and the activation energy Q obtained, the appropriate reflow range in FIG. 18 was transformed to an appropriate reflow range in a temperature profile with one peak. All temperature profiles with one peak, in which the maximum temperature in the range of 225° C. to 260° C. considered suitable for the connection condition of solder balls of Sn3Ag0.5Cu was divided into 1° C. units and the reflow time in the range of 10 to 100 s was divided into 10 s units, were approximated to a sinusoidal half wave in FIG. 11, were divided into minute intervals, and from the values of the frequency factor D0 and the activation energy Q that had been obtained, the chemical compound thickness for each of the minute intervals was calculated by using Eqs. (1) and (2), and the chemical compound thicknesses for all heat loads were obtained and stored as a database. Because the connection interface strength drops in 60 s at 250° C. in the appropriate reflow range in FIG. 18, this condition was regarded as a border between appropriate and inappropriate, a range of a temperature profile with one peak corresponding to a chemical compound thickness when the connection was carried out under this condition was obtained from the database. FIG. 21 shows a connection temperature appropriate reflow range in a temperature profile with one peak. For simplicity's sake, in the above calculations, the bump forming condition, the reflow condition to the circuit board, and the condition of heat load applied in rework were all supposed to be identical, an appropriate reflow range obtained with the number of rework taken into account is also shown.

A verification process was carried out on the appropriate reflow range in a temperature profile with one peak that was obtained as shown in FIG. 21. In a circuit board with electrode pads formed as the metallization of Cu/electroplated Ni/Au, solder bumps were formed by reflow-connecting solder balls of Sn3Ag0.5Cu to the electrode pads. As the reflow condition, a temperature profile with one peak having the maximum temperature of 240° C. and the reflow times, at not lower than 217° C. as the melting point of Sn3Ag0.5Cu, of 15 s, 25 s, 35 s, and 60 s was used, and heat load was applied once to four times to each sample. After this, a shear test was carried out on the formed solder bumps. The number of bumps put to shear test was ten in each sample. Fracture occurred in solder in all samples in which the solder bumps were connected for reflow time of 15 s at 217° C. or higher and which were given a reflow process 1 to 4 times. On the other hand, a fracture mode occurred in which the interface split: in those samples of reflow time of 25 s subjected to a reflow process 4 times, in those samples of reflow time of 35 s subjected to the reflow process 3 to 4 times, and in those samples of reflow time of 60 s subjected to the reflow process 2, 3 or 4 times. As described, it could be verified that the appropriate reflow range in a temperature profile with one peak in FIG. 21 is most likely to be correct.

As a solution to the problem that the connection interface strength decreases due to differences in heat capacity of the parts connected and also due to increases in heat load by repeated rework, which have not been considered at all, according to the present invention, it becomes possible to obtain an appropriate reflow range in which satisfactory connections can be obtained without any decrease in the connection interface strength in an optional profile with one peak shown in FIG. 16, for example.

As has been described, according to the present invention, it is possible to inhibit the lowering of connection interface strength of electronic devices.

INDUSTRIAL APPLICABILITY

It ought to be noted that the present invention in this patent application concerns semiconductor devices and has industrial applicability.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method for calculating a connection condition, comprising the steps of:
   carrying out solder connection by a solder by changing a connection condition for connecting bumps of an electronic part to electrodes on an electronic circuit board, thereby forming soldered joints;
   conducting a connection strength evaluation test on said soldered joints to thereby obtain a connection condition free of fracture at an interface between said solder and said electrodes; and
   transforming said connection condition free of fracture at the interface between said solder and said electrodes, by using a thickness of a chemical compound at a connection interface determined uniquely by heat load as a standard into an optional connection condition with the same chemical compound thickness and with one temperature peak to thereby obtain a generalized connection condition.

2. A method for calculating a connection condition according to claim 1, further comprising a step of transforming said connection condition free of fracture at the interface between said solder and said electrodes, by using heat load as a standard into an optional connection condition with heat load remaining the same to thereby obtain a generalized connection condition.

3. A method for calculating a connection condition according to claim 2, further comprising the step of transforming said connection condition free of fracture at the interface between said solder and said electrodes, by using said heat load as the standard into an optional connection condition with one temperature peak and with the same heat load to thereby obtain a generalized connection condition.

4. A method for calculating a connection condition according to claim 1, further comprising:
   deriving a diffusion constant by Arrhenius plot after obtaining the thickness of the chemical compound; and
   transforming an optional profile with one peak into a profile at constant temperature.

5. A method for calculating a connection condition according to claim 1, further comprising:
   a step of conducting a shear strength evaluation test on the solder bumps; and
   a step of deriving an appropriate reflow range in constant temperature profile after the step of conducting the shear strength evaluation test.

6. A method for calculating a connection condition according to claim 1, wherein said carrying out solder connection is performed at a constant reflow temperature; and wherein said transforming is performed to transform said connection condition free of fracture at the interface between said solder and said electrodes, determined in connection with said solder connection carried out at said constant reflow temperature, to said optional connection condition with said one temperature peak to thereby obtain said generalized connection condition.

7. A method for calculating a connection condition according to claim 1, wherein said carrying out solder connection is performed at a constant reflow temperature.

8. A method for calculating a connection condition according to claim 7, wherein bumps of electronic parts are connected to electrodes on a plurality of electronic circuit boards, respectively, using different temperature reflow profiles in connection with respective electronic circuit boards, each of which different reflow temperature profiles has a constant reflow temperature; and said connection strength evaluation test is conducted on soldered joints of said plurality of electronic circuit boards.

* * * * *